United States Patent
Choi

Patent Number: 5,959,919
Date of Patent: Sep. 28, 1999

[54] LOW POWER SENSE AMPLIFIER FOR SEMICONDUCTOR MEMORY DEVICES

[75] Inventor: Jae-Seung Choi, Ich'on, Rep. of Korea

[73] Assignee: Hyundai Electronics Industries Co., Ltd., Ich'on, Rep. of Korea

[21] Appl. No.: 08/974,635

[22] Filed: Nov. 19, 1997

[30] Foreign Application Priority Data

Nov. 22, 1996 [KR] Rep. of Korea .................. 96-56262

[51] Int. Cl.⁶ ............................................. G11C 7/00
[52] U.S. Cl. ..................... 365/207; 365/208; 327/52; 327/55
[58] Field of Search ................................ 365/207, 205, 365/208, 189.07; 327/52, 55, 57

[56] References Cited

U.S. PATENT DOCUMENTS

| | | | |
|---|---|---|---|
| 4,716,320 | 12/1987 | McAdams | 307/530 |
| 4,766,572 | 8/1988 | Kobayashi | 365/190 |
| 5,243,573 | 9/1993 | Makihara et al. | 365/205 |
| 5,247,483 | 9/1993 | Okamoto | 365/205 |
| 5,491,435 | 2/1996 | Mun et al. | 327/55 |
| 5,504,443 | 4/1996 | Gross et al. | 365/207 |
| 5,523,978 | 6/1996 | Yoon et al. | 365/229 |
| 5,526,314 | 6/1996 | Kumar | 327/52 |
| 5,559,737 | 9/1996 | Tanaka et al. | 365/185.25 |
| 5,561,629 | 10/1996 | Curd | 365/185.21 |
| 5,668,765 | 9/1997 | Ang | 365/205 |
| 5,710,739 | 1/1998 | Calligaro et al. | 365/207 |
| 5,771,197 | 6/1998 | Kim | 365/207 |
| 5,804,992 | 9/1998 | Lee | 327/55 |

Primary Examiner—Tan T. Nguyen
Attorney, Agent, or Firm—Ware, Fressola, Van Der Sluys & Adolphson LLP

[57] ABSTRACT

A low power sense amplifier for semiconductor memory devices includes: a sense-amplifying part that senses and amplifies first and second input signals from first and second input terminals, and produces first and second output signals having different voltage levels from each other via the first and second output terminals; a charging part for charging the first and second output terminals of the sense-amplifying part prior to the sensing and amplifying operation of the sense-amplifying part; a control part for producing a control signal for disabling the sense amplifying part if the sense-amplifying part produces output signals having different voltage levels from each other.

51 Claims, 18 Drawing Sheets

18 / 18

LOW POWER SENSE AMPLIFIER FOR SEMICONDUCTOR MEMORY DEVICES

BACKGROUND OF THE INVENTION

1. Field of the Invention

The present invention generally relates to semiconductor memory devices, and more particularly to a low power sense amplifier that can reduce power consumption by enabling the sense amplifier only during a data sense period.

FIG. 1 is a circuit diagram of a conventional sense amplifier. As illustrated in FIG. 1, the conventional sense amplifier comprises first and second PMOS transistors MP11, MP12 that are a latch, first and second NMOS transistors MN11, MN12 which amplify input signals from the input terminals IN11, IN12 and produce predetermined output signals through the output terminals OUT11, OUT12, and a third NMOS transistor MN13 which enables the first and the second NMOS transistors MN11, MN12 when the sense amplifier is enabled.

In the conventional sense amplifier as described above, when the sense amplifier enable signal SE is in a high state, i.e., in a data sensing period, a high state sense amplifier enable signal SE is applied to a gate of the third transistor MN13 to be turned on. Hence the first and the second NMOS transistors MN11, MN12 sense and amplify the input signals from the input terminals IN11, IN12 and produce output signals having different signal levels from each other first and second output terminals OUT11, OUT12 respectively.

On the other hand, when the sense amplifier enable signal SE is in a low state, i.e., not in a data sense period, the third NMOS transistor MN13 is turned off and thus the first and second transistors MN11, MN12 do not perform data sensing and amplifying operations.

FIG. 2 is a circuit diagram of a conventional sense amplifier for a nonvolatile memory device. The alternative sense amplifier as illustrated in FIG. 2 comprises a precharging part 25 that precharges a dummy line 22 connected to a dummy cell 21 and a bit line 24 connected to a memory cell 23 according to an equalizing signal /EQ; and a sense-amplifying part 26 that senses and amplifies voltages difference between the dummy line 22 and the bit line 24 and produces output signals via first and second output terminals OUT21, OUT22.

The precharging part 25 comprises first precharging means 25-1 comprising first through third PMOS transistors MP21–MP23 that precharges the dummy line 22; and second precharging means 25-2 comprising fourth through sixth PMOS transistors MP24–MP26 that precharges the bit line 24.

The sense amplifier 26 comprises seventh and eighth PMOS transistors MP27, MP28 that are a latch; first and second NMOS transistors MN21, MN22 that sense and amplify voltage difference between the dummy line 23 and the bit line 24; a third NMOS transistor MN23 that activates the first and the second transistors MN21, MN22, which is driven by a sense amplifier enable signal SE.

Also, the sense amplifier as illustrated in FIG. 2 further comprises pass transistors, i.e., fourth and fifth NMOS transistors MN24, MN25 driven by a reference voltage Vref from a reference voltage generator(not illustrated), in which the fourth and fifth NMOS transistors MN24, MN25 apply voltages from the dummy line 22 and the bit line 24 to the first and second NMOS transistors MN21, MN22 respectively; and a sixth NMOS transistor MN26 which equalizes according to an equalizing signal /EQ the dummy line 22 and the bit line 24.

The first and the second precharge means 25-1, 25-2 of the sense amplifier having a structure as illustrated in FIG. 2 precharge the dummy line 22 and the bit line 24 according to an equalizing signal /EQ outside a data sense period.

Also, the sixth NMOS transistor MN26 is activated by the equalizing signal EQ, and the dummy line 22 and the bit line come to be equalized to a same potential.

In this period, the third transistor MN23 of the sense-amplifying part 26 is turned off according to the low state sense amplifier enable signal SE, and the sense-amplifying operation of the first and second NMOS transistors MN21, MN22 do not take effect.

In one hand, during a data sense period, the third NMOS transistor MN23 of the sense-amplifying part 26 is turned on according to the high state sense amplifier enable signal SE. Hence, the first and second NMOS transistors MN21, MN22 sense and amplify the voltage from the dummy line 22 and the bit line 24 are applied to their gates respectively, and produce output signals of two different levels through the first and second output terminals OUT21, OUT22.

FIG. 3 is yet another conventional sense amplifier of a nonvolatile semiconductor memory device.

As illustrated in FIG. 3, the sense amplifier has a structure similar to that of FIG. 2. It comprises a precharging part 35 comprising first precharging means 35-1, which includes first through fourth PMOS transistors MP31~MP34 for precharging a dummy line 33 according to an equalizing signal /EQ, and second precharging means 35-2, which includes fifth through eighth PMOS transistors MP35~MP38 for precharging a bit line 34 according to the equalizing signal /EQ; and a sense-amplifying part 36 for sensing and amplifying voltages from the dummy line 33 and the bit line 34.

For the sense amplifier shown in FIG. 3, the sense-amplifying part 36 comprises two stages of a first sense-amplifying stage 36-1 and a second sense-amplifying stage 36-2. The first sense amplifying stage 36-1 comprises first and second NMOS transistors MN31, MN32 for producing output signals SOUT31, SOUT32 by sensing and amplifying the voltages from the dummy line 33 and the bit line 34; third and fourth NMOS transistors MN33, MN34 which are a latch; a fifth NMOS transistor MN35 for driving the third and fourth NMOS transistors MN33, MN34 according to the sense amplifier enable signal SE.

Also, the first sense-amplifying part of FIG. 3 further comprises a ninth PMOS transistor MP39 of which the sense amplifier enable signal SE is applied to the gate for maintaining voltage level of the output terminals SOUT31, SOUT32 in the same potential.

The second sense-amplifying stage 36-2 comprises tenth and eleventh PMOS transistors MP40, MP41 which are a latch; sixth and seventh NMOS transistors MN36, MN37 for sensing and amplifying the output signals SOUT31, SOUT32 of the first sense-amplifying stage 36-1; an eighth NMOS transistor MN38 for driving the sixth and seventh NMOS transistors MN36, MN37 according to the sense amplifier enable signal SE.

Furthermore, the sense amplifier of FIG. 3 further comprises a ninth NMOS transistor MN39 for equalizing the dummy line 33 and the bit line 34 according to the equalizing signal EQ; and tenth and eleventh NMOS path transistors MN40, MN41 driven by a reference voltage Vref from a reference voltage generator(not illustrated) for providing voltages from the dummy line 33 and the bit line 34 to the gates of the first and the second NMOS transistors MN31, MN32. The voltages from the dummy line 33 and the bit line 34 are the input signals for the sense-amplifying part 36.

The operation of the sense amplifier of FIG. 3 is the same as that of the sense amplifier of FIG. 2. The voltages from the dummy line 33 and the bit line 34 are sensed and amplified by the first sense-amplifying stage 36-1 of the sense-amplifying part 36. Then the output signals SOUT31, SOUT32 of the first sense-amplifying stage 36-1 is again sensed and amplified by the second sense-amplifying part 36-2. The final output signals having different voltage levels from each other are produced through the first and second output terminals OUT31, OUT32.

The sense amplifier enhances the sense margin by employing a two stage amplification of the voltages of the dummy line 33 and the bit line 34.

When the high state sense amplifier signal is introduced to the sense amplifiers of FIG. 1 through FIG. 3 to activate them, input data is sensed and amplified. The sensed and amplified data is then produced as the output data. To disable the sense amplifiers after the sensing and amplifying process, a low state sense amplifier enable signal must be introduced after a predetermined time the high state sense amplifier enable signal is introduced.

For a sense amplifier as described above to sense a data, adequate sense time must be provided. This is done by setting the pulse width of the sense amplifier enable signal large enough to meet the conditions described above.

However, as the current consumption is proportional to the pulse width, considerable power is consumed when each of the sense amplifier enable signal is set to have a width sufficiently large in one chip.

SUMMARY OF THE INVENTION

The object of the present invention is to provide a low power consuming sense amplifier that is enabled only during data sensing operation and is automatically disabled upon termination of the data sensing period.

To accomplish the object of the present invention, a sense amplifier of the present invention comprises sense-amplifying means that according to an internal control signal, senses and amplifies first and second input signals supplied through first and second input terminals respectively, and produces first and second output signals having different voltage levels from each other through first and second output terminals respectively; charging means for charging the first and second output terminals with a desired voltage according to an external control signal prior to sensing and amplifying operation of said sense-amplifying means; control means for receiving the external control signal and the first and second output signals from said sense-amplifying means, and generating the internal control signal to the sense-amplifying means when said sense-amplifying means produces said first and second output signals of different levels.

The sense-amplifying means comprises first means for sensing and amplifying said first and second input signals from said first and second input terminals, and producing first and second output signals having different voltage levels from each other through said first and second output terminals; a latch for storing said first and second output signals from said first means; second means for enabling said first means according to said internal control signal from the control means.

The charging means comprises first charging means for charging the first output terminal with a power supply voltage comprising a first PMOS transistor in which said external control signal is introduced to its gate; second charging means for charging the second output terminal with the power supply voltage comprising a second PMOS transistor in which said external control signal is introduced to its gate.

The control means comprises inverting means for inverting the external control signal; detecting means for detecting whether the sensing and amplifying operation of the sense-amplifying means is terminated by the first and second output signals from the first and second output terminals; control signal generating means for receiving said inverted external control signal from said inverting means and an output signal from said detecting means, and generating said internal control signal to the sense-amplifying means.

The inverting means of the control means comprises an inverting gate for inverting the internal control signal. The detecting means comprises a NAND gate, which inputs the first and second output signals from the first and second output terminals of the sense-amplifying means, and outputs the high state output signal as a detecting signal when the sense-amplifying means senses and amplifies the input signals and then generates the output signals of different voltage levels. The control signal generating means comprises a NOR gate which inputs the output signal of the detecting means and the external control signal inverted through the inverting means, and outputs the internal control signal to disabling the sense-amplifying means upon termination of sensing and amplifying operation.

The detecting means of the control means can be embodied in a 2-input XOR gate. Also, the detecting means and the control signal generating means of the control means can be embodied in a single three input XOR gate.

The sense-amplifying means comprises a first sense-amplifying stage for performing sensing and amplifying operation for the first and second input signals introduced into the first and the second input terminals; a second sense-amplifying stage for performing sensing and amplifying operation for the output signals of the first sense-amplifying stage, and producing the first and second output signals via the first and second output terminals.

BRIEF DESCRIPTION OF THE DRAWINGS

These and other features, aspects, and advantages of the present invention will be better understood with reference to the following description, appended claims, and the accompanying drawings, wherein

DETAILED DESCRIPTION OF THE INVENTION

Figure 1:
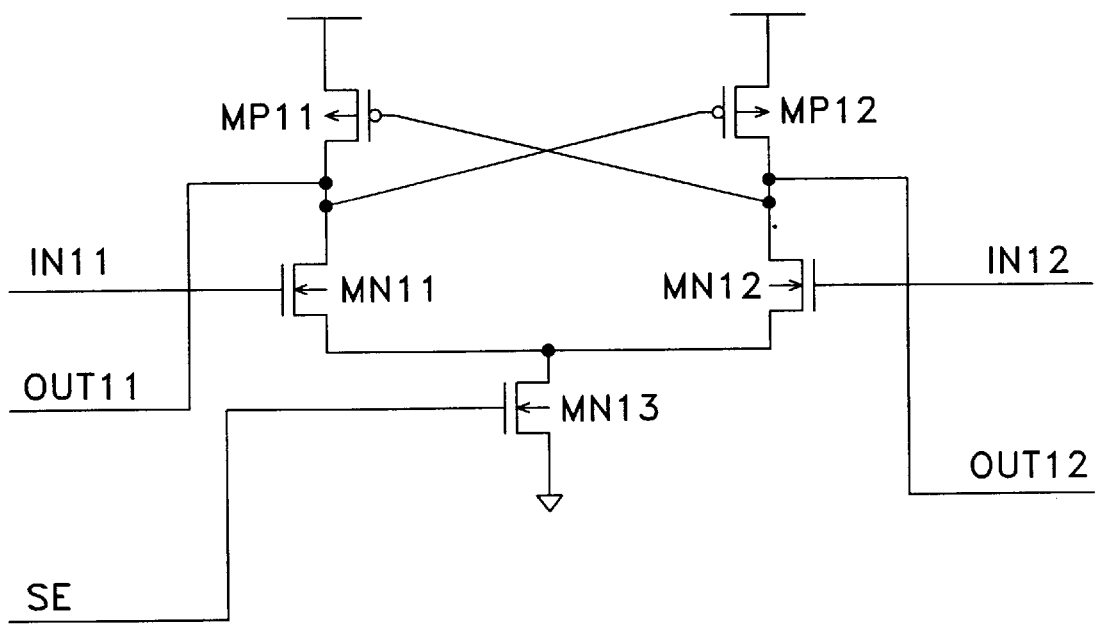
FIG. 1 is a circuit diagram of a conventional sense amplifier.
Figure 2:
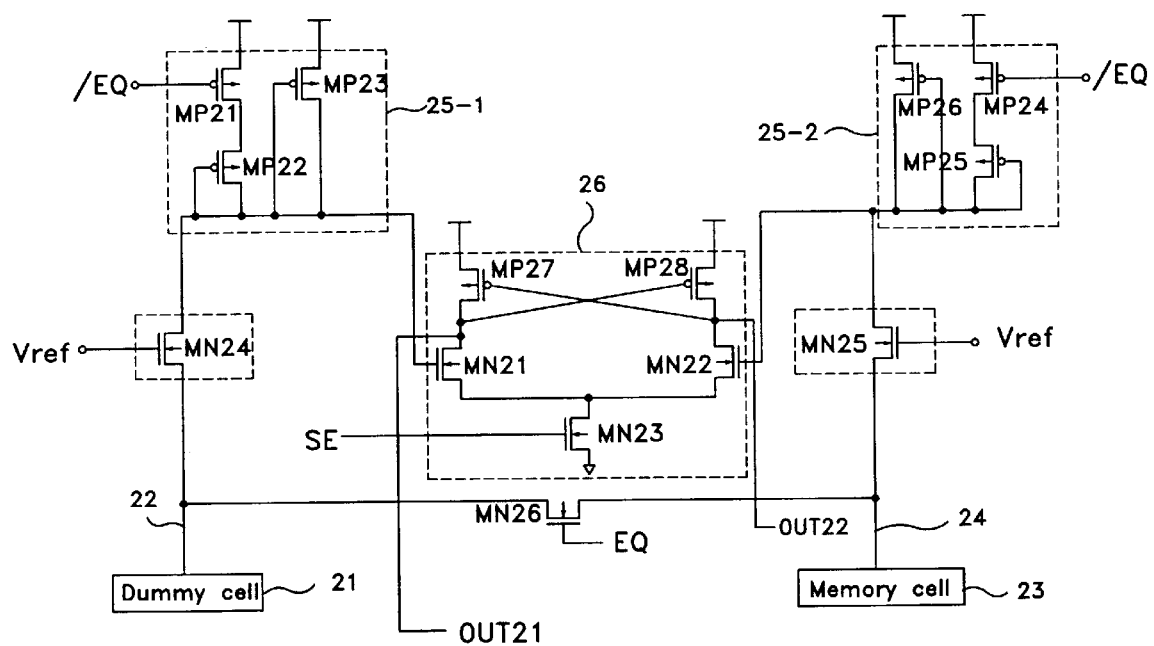
FIG. 2 is a circuit diagram of a conventional sense amplifier for a nonvolatile memory device.
Figure 3:
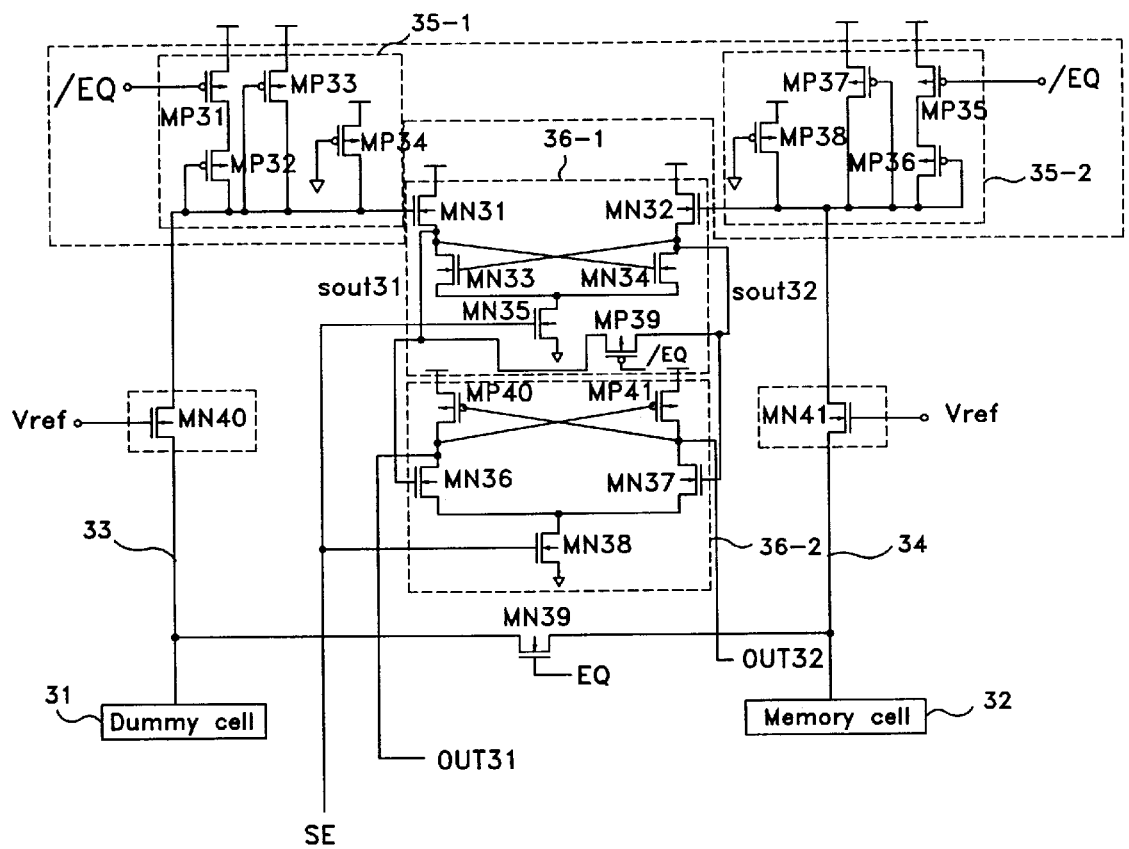
FIG. 3 is yet another conventional sense amplifier of a nonvolatile semiconductor memory device.
Figure 4:
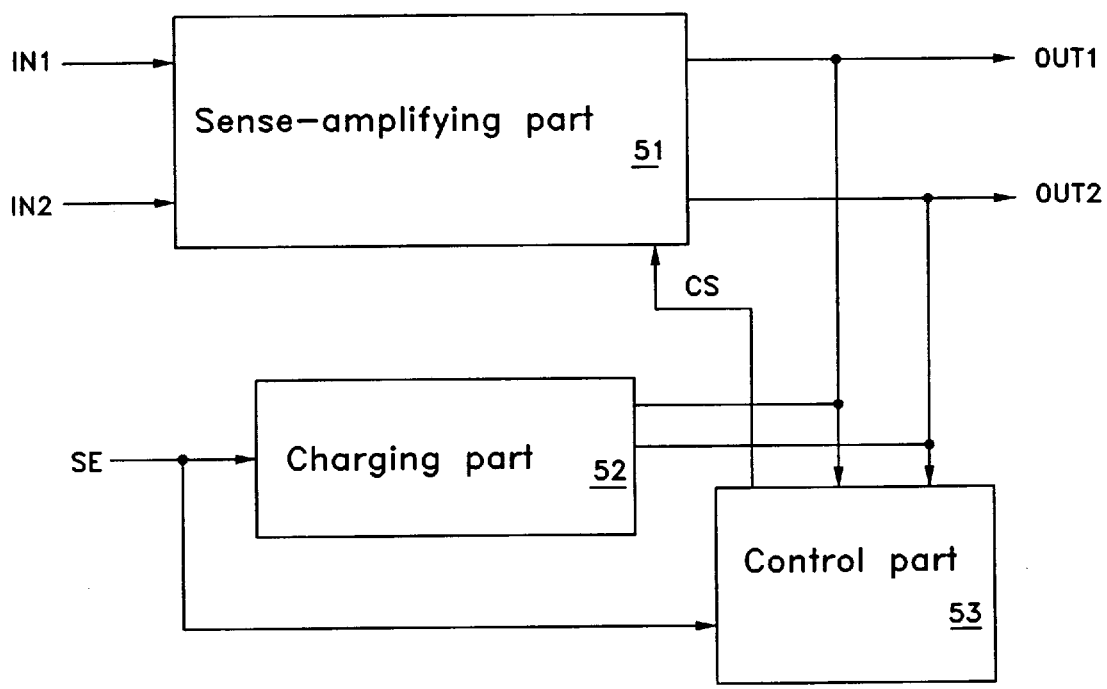
FIG. 4 is a block diagram of a sense amplifier according to an embodiment of the present invention.

FIG. 4 is a block diagram of a sense amplifier according to an embodiment of the present invention. As illustrated in FIG. 4, the sense amplifier according to an embodiment of the present invention comprises a sense-amplifying part 51, in which first and second input signals introduced via first and second input terminals IN1, IN2 respectively are sensed and amplified, and a first and a second output signals having different levels from each other are produced via first and second output terminals OUT1, OUT2 respectively in accordance with an internal control signal CS; a charging part 52 driven by an external control signal, i.e., a sense amplifier enable signal SE for charging the output terminals OUT1, OUT2 to the desired voltage prior to the sensing and amplifying operation of the sense-amplifying part 51; a control part 53 for producing the internal control signal CS for disabling the sense-amplifying part 51 when the sense-amplifying part 51 senses the first and second input signals from the first and second input terminals and produces output signals having different levels from each other via first and second output terminals OUT1, OUT2.

When the low state sense amplifier enable signal SE is introduced into the sense amplifier of the present embodiment, i.e., in a data non-sensing period, the charging part 52 is activated and precharges the first and second output terminals OUT1, OUT2 of the sense-amplifying part 51 with the power supply voltage.

At this moment, since the low state sense amplifier enable signal SE is also introduced into the control part 53, the control part 53 generates the internal control signal CS for disabling the sense-amplifying part 51. Hence the sense-amplifying part 51 does not carry out the sensing and amplifying operation due to the internal control signal CS.

On the contrary, when the high state sense amplifier enable signal SE is introduced, the sense-amplifying part 51 senses and amplifies the input signals introduced via first and second input terminals IN1, IN2, and produces output signals having different levels from each other via first and second output terminals OUT1, OUT2.

The control part 53 inputs the output signals OUT1, OUT2 of the sense-amplifying part 51 and the sense amplifier enable signal SE as an external control signal, and produces the control signal CS of low state for disabling the sense-amplifying part 51.

Hence when the data sense operation is terminated under the high state sense amplifier enable signal SE, the sense-amplifying part 51 is disabled according to the control signal CS of low state from the control part 53.

Accordingly, the sense amplifier according to an embodiment of the present invention is automatically disabled by the control part 53 regardless of the high state sense amplifier enable signal SE when the data sense operation is terminated. Hence the sense amplifier of the present embodiment can reduce current consumption compared to the conventional sense amplifier which is activated during the entire high state sense amplifier enable signal SE.

Figure 5A:
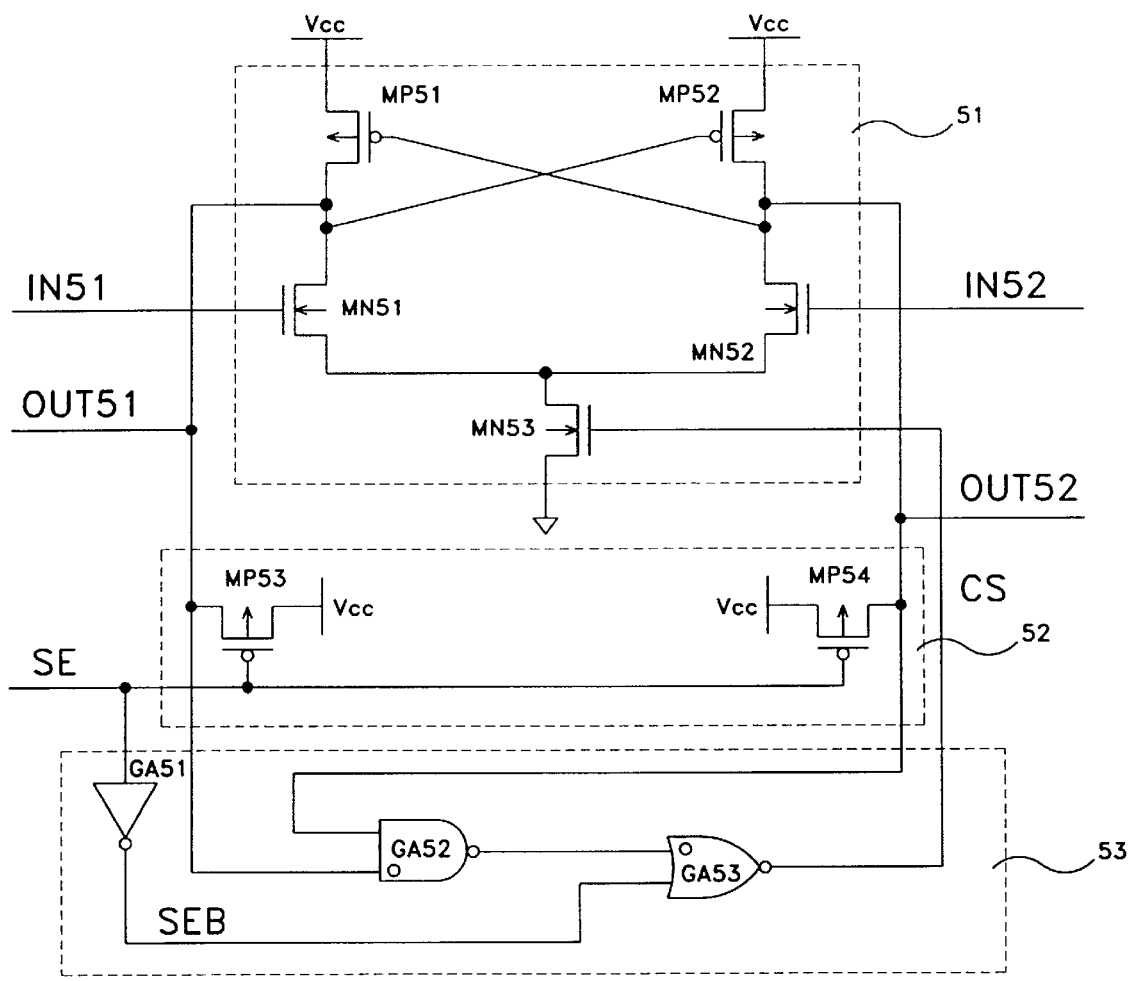
FIG. 5A is a detailed circuit diagram of a sense amplifier according to a first embodiment of the present invention.

FIG. 5A is a detailed circuit diagram of a sense amplifier according to a first embodiment of the present invention. According to FIG. 5A, the sense amplifier according to the first embodiment comprises a sense-amplifying part 51, which according to an internal control signal CS senses and amplifies first and second input signals introduced via first and second input terminals IN51, IN52 respectively, and then produces a first and a second output signals having different levels from each other via first and second output terminals OUT51, OUT52 respectively; a charging part 52 driven by a sense amplifier enable signal SE for charging the output terminals OUT1, OUT2 to the power supply voltage prior to the sensing and amplifying operation of the sense-amplifying part 51; a control part 53 for producing said internal control signal CS for disabling the sense-amplifying part 51 when the sense-amplifying part 51 senses the input signals from the first and second input terminals and then produces output signals having different levels from each other via first and second output terminals OUT1, OUT2.

The sense-amplifying part 51 comprises first and second NMOS transistors MN51, MN52, in which first and second input signals introduced via first and second input terminals IN51, IN52 respectively are sensed and amplified, and then first and second output signals having different levels from each other are produced via first and second output terminals OUT51, OUT52 respectively; first and second PMOS transistors MP51, MP52 that play a role of a latch for storing the first and second output signals from the first and second NMOS transistors MN51, MN52; a third NMOS transistor MN53 that plays a role of means for enabling for the first and second NMOS transistors MN51, MN52, driven by the internal control signal CS of the control part 53.

The charging part 52 comprises third and fourth PMOS transistors MP53, MP54 driven by the sense amplifier enable signal SE as an external control signal introduced to their respective gates for charging the output terminals OUT51, OUT52 to the power supply voltage Vcc.

The control part 53 comprises inverting means for inverting the sense amplifier enable signal SE; detecting means for detecting whether the data sense operation of the sense-amplifying part 51 is terminated by receiving first and second output signals of the sense-amplifying part 51; control signal generating means for producing the control signal CS by receiving an inverted sense amplifier enable signal SEB from the inverting means and an output signal from the detecting means.

The inverting means of the control part 53 comprises an inverting gate GA51, which inputs the sense amplifier enable signal SE. The detecting means of the control part 53 comprises a NAND gate GA52, which inputs the output signals of the first and second output terminals OUT51, OUT52, and outputs a high state output signal as a detecting signal when the sense-amplifying part 51 generates output signals having different levels from each other through output terminals OUT1, OUT2. At this time, the output signals from OUT51, OUT52 have different voltage levels for each other when the data sense operation is terminated. The control signal generating means comprises a NOR gate GA53 for receiving an inverted sense amplifier enable signal SEB from the inverting means and the output signal from the detecting means, and producing the control signal after the termination of the data sense operation.

The following is a description of the operation of the sense amplifier according to the first embodiment of the present invention.

First, when the sense amplifier enable signal SE is in a low state, i.e., in a disable period for the sense amplifier, the third and fourth PMOS transistors MP53, MP54 are turned on thus charging the both of the first and second output terminals OUT51, OUT52 to a high state of the power supply voltage Vcc.

On the other hand, the inverting gate GA51 of the control part 53 inverts the low state sense enable signal SE and introduces the inverted signal, i.e., the high state sense amplifier enable signal SEB into one of the input terminals of the NOR gate GA53. Then the control part 53 introduces a low state control signal CS into the sense-amplifying part 51 through the NOR gate GA53.

Accordingly, during the disable period of the sense amplifier, the third NMOS transistor MN53 is turned off thus the first and second NMOS transistors MN51, MN52 are disabled and the first and the second output terminals OUT51, OUT52 are maintained at a high state by the charging part 52.

On the other hand, when the high state sense amplifier enable signal SE is introduced to enable the sense amplifier, the inverted sense amplifier enable signal, i.e., a low state signal is produced by the inverter gate GA51. The low state signal SE is then introduced into one of the input terminals of the NOR gate GA53. The NAND gate GA52 which inputs the high state signals of the first and second output terminals OUT51, OUT52 and generates the output signal of a low state to the other input terminal of the NOR gate GA53.

Accordingly, the output signal of the NOR gate GA53 is in a high state. Thus the control part 53 introduces a high state control signal CS into the third NMOS transistor MN53, turning the third NMOS transistor on. Accordingly, the first and second NMOS transistors MN51, MN52 sense and amplify the input signals from the input terminals IN51, IN52. Then the first and second NMOS transistors MN51, MN52 generates output signals having different voltage levels from each other via first and second output terminals OUT51, OUT52.

When the data sense operation of the sense-amplifying part 51 is terminated, output signals of the sense-amplifying part 51 having different voltage levels cause the NAND gate GA52 of the control part 53 to produce a high state output signal. Hence the NOR gate GA53 introduces the low state control signal CS into the sense-amplifying part 51.

The low state control signal CS introduced from the control part 53 causes the third NMOS transistor MN53 to turn off. Thus the data sense operation of the sense-amplifying section is terminated.

As described above, the sense amplifier detects the termination of the data sensing operation through the NAND gate GA52 and upon this detection, automatically produces the control signal CS of a low state through the control part 53 to disable sense-amplifying part 51, regardless of the high state sense amplifier enable signal SE. Accordingly, no more data sensing operation is carried out through the sense-amplifying part 51.

Thus the sense amplifier according to the present embodiment can reduce current consumption required in sensing data to a minimum level by automatically disabling the sense-amplifying part 51 upon termination of the data sensing operation according to the output signal of the control part 53, regardless of the high state sense amplifier enable signal SE.

Figure 5B:
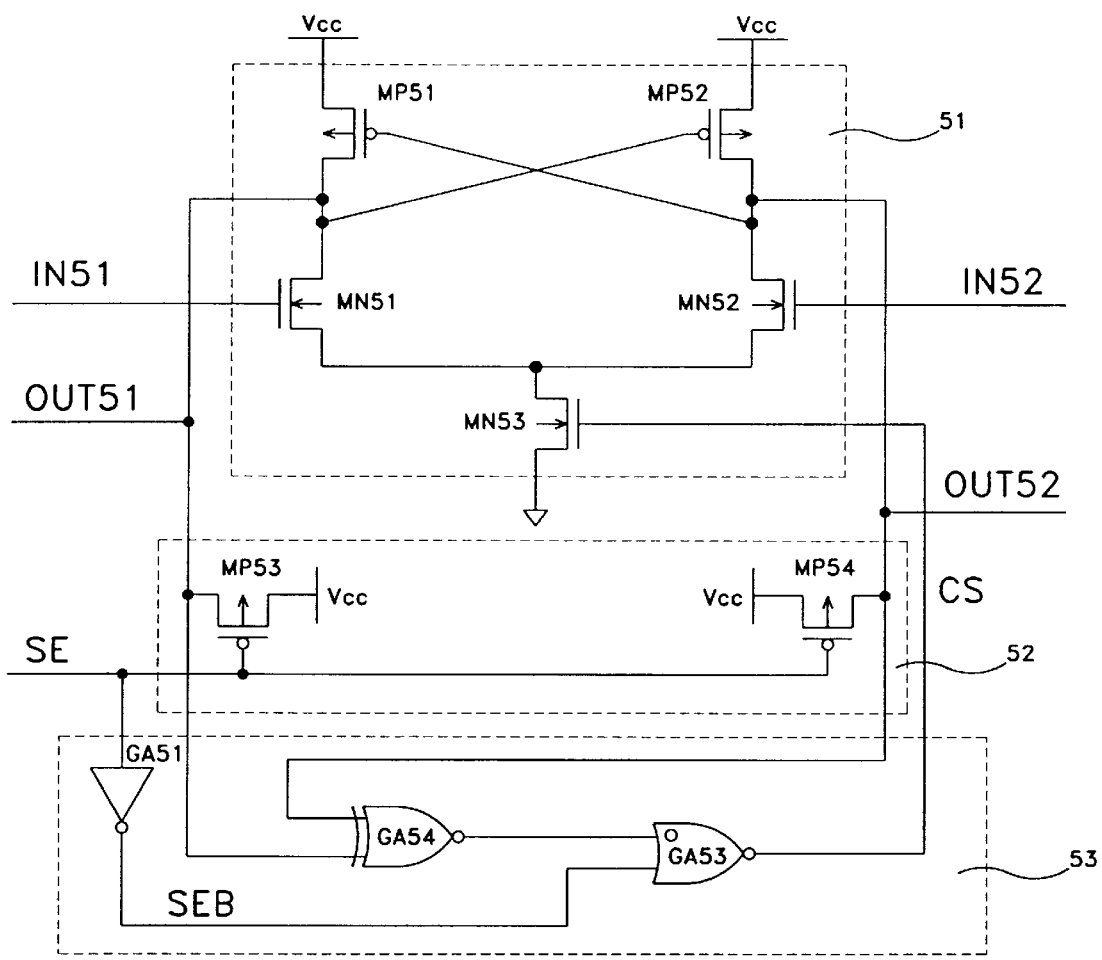
FIGS. 5B and 5C are alternative examples of the control part shown in FIG. 5A.
Figure 5C:
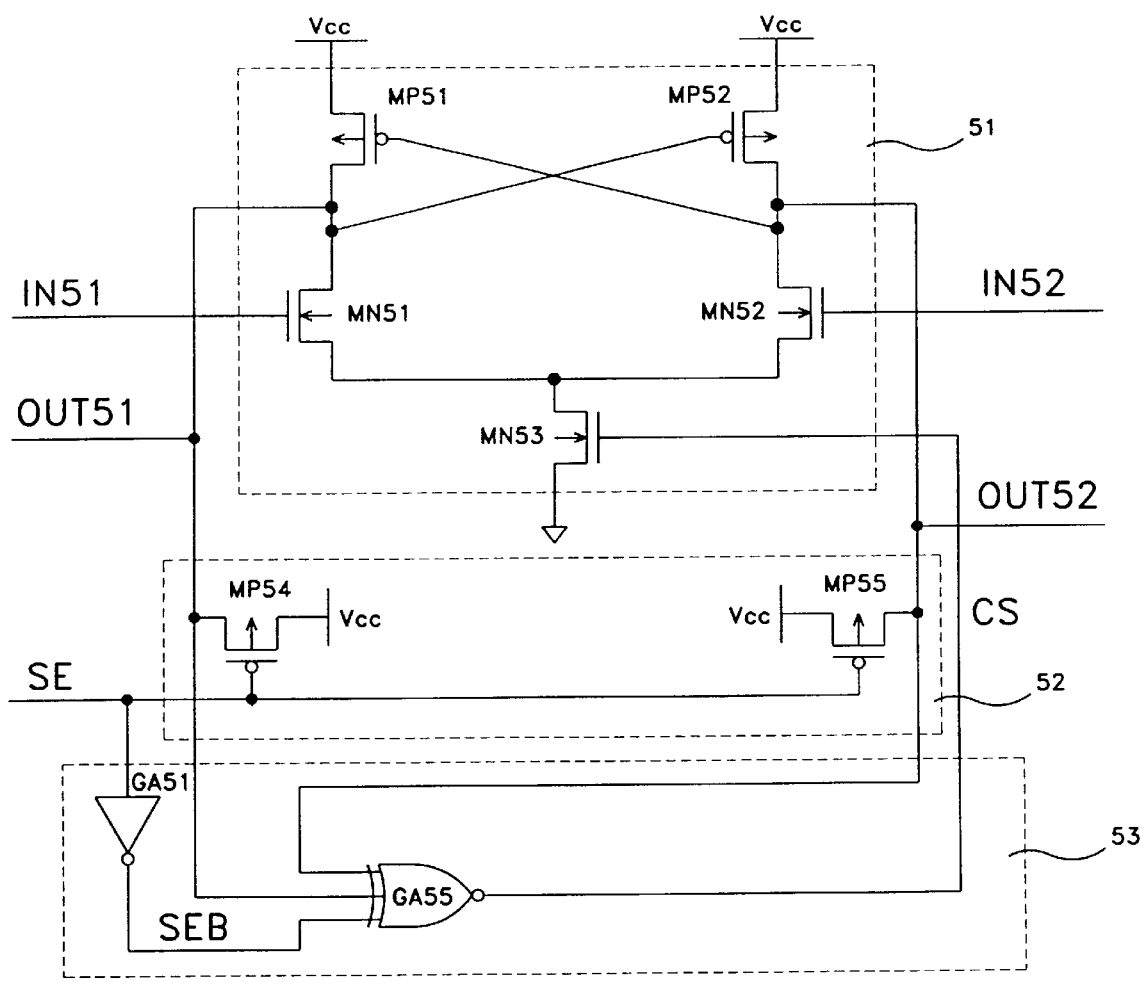

FIG. 5B and FIG. 5C are alternative examples of the control part 53 shown in FIG. 5A.

The detecting means which detects the termination of the data sensing operation upon introduction of the output signals from the first and second output terminals OUT51, OUT52 in the control part 53 shown in FIG. 5B is a two input XNOR gate GA54 instead of the NAND gate GA52.

In the control part 53 of FIG. 5C, the detecting means which detects the termination of the data sensing operation upon introduction of the output signals from the first and second output terminals OUT51, OUT52, and the control signal generating means which generates the control signal CS according to detection result are embodied in a single 3 input XNOR gate GA55.

Figure 6:
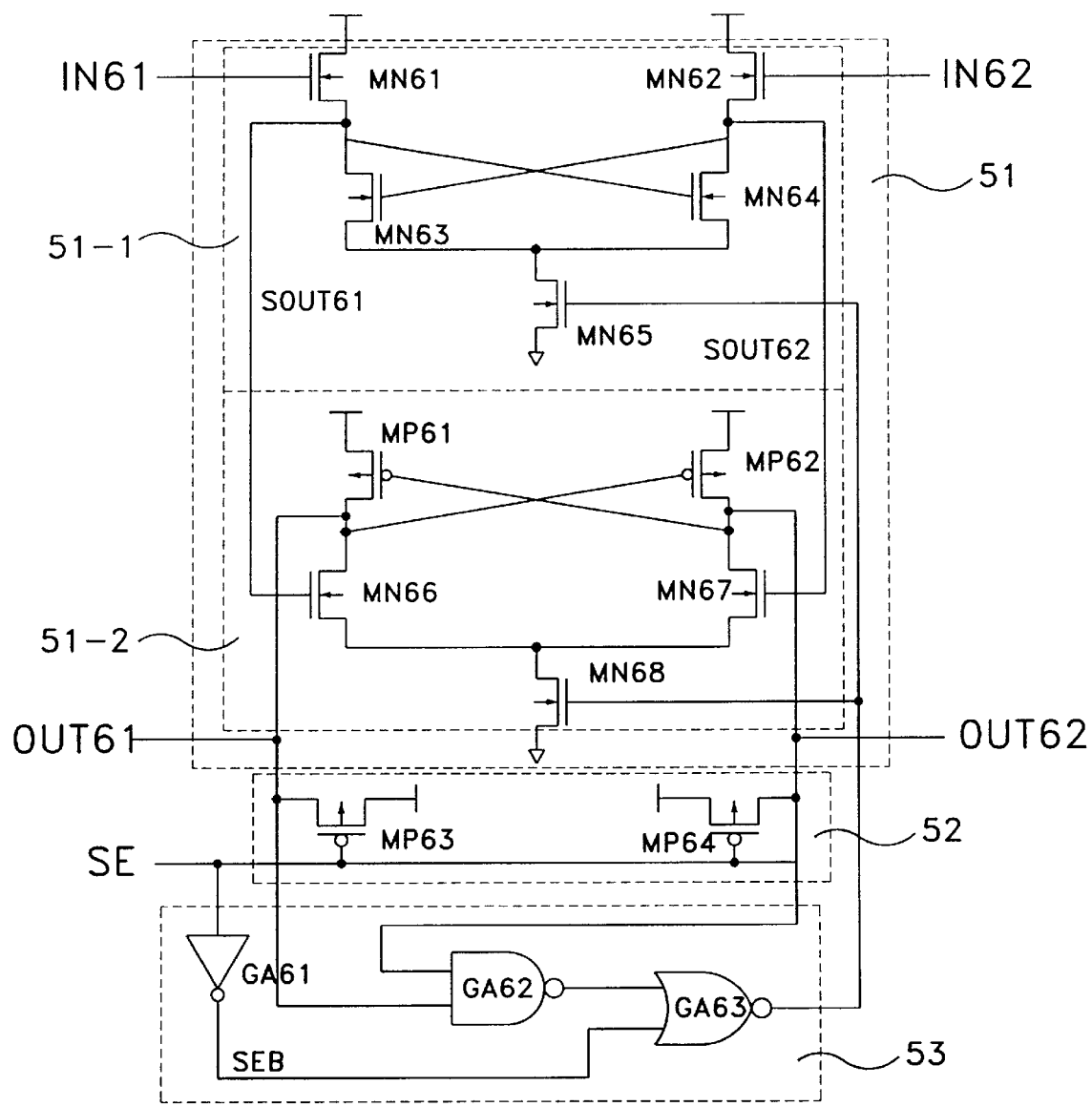
FIG. 6 is a detailed circuit diagram of a sense amplifier for semiconductor memory devices according to a second embodiment of the present invention.

FIG. 6 is a detailed circuit diagram of a sense amplifier for semiconductor memory devices according to a second embodiment of the present invention.

The sense amplifier according to the second embodiment of the present invention, similar to the first embodiment, comprises a sense-amplifying part 51, a charging part 52, and a control part 53. The structure of the charging part 52 and the control part 53 of the second embodiment are the same as that of the first embodiment.

However, the sense-amplifying part 51 comprises two sense-amplifying stages. In detail, the sense-amplifying part 51 comprises a first sense-amplifying stage 51-1 for producing predetermined output signals SOUT61, SOUT62 by sensing and amplifying the input signals introduced into first and second input terminals IN61, IN62; a second sense-amplifying stage 51-2 for producing final output signals via first and second output terminals OUT61, OUT62 by sensing and amplifying the output signals SOUT61, SOUT62 from the first sense-amplifying stage 51-1.

The first sense-amplifying stage 51-1 comprises first and second NMOS transistors MN61, MN62 for producing predetermined output signals SOUT61, SOUT62 by sensing and amplifying first and second input signals IN61, IN62; third and fourth NMOS transistors MN63, MN64 that are latch for storing output signals form the first and second transistors MN61, MN62; a fifth NMOS transistor activated according to the control signal CS introduced via its gate for driving the third and fourth transistors MN63, MN64.

The second sense-amplifying stage 51-2 comprises sixth and seventh NMOS transistors MN66, MN67 for producing final output signals via output terminals OUT61, OUT62 by sensing and amplifying the output signals SOUT61, SOUT62 from the first sense-amplifying stage 51-1; first and second PMOS transistors MP61, MP62 that are a latch for storing the first and second output signals from the sixth and seventh NMOS transistors MN66, MN67; an eight NMOS transistor MN68 which is an enabling means activated according to the control signal CS introduced via its gate for enabling the sixth and seventh NMOS transistors MN66, MN67.

If the low state sense amplifier enable signal SE is introduced to the sense amplifier according to the second embodiment, the low state control signal CS is produced via the NOR gate GA63 of the control part 53.

Hence, the enabling means of the first and second sense-amplifying stages 51-1, 51-2, i.e., the fifth and eighth NMOS transistors MN65, MN68 are both turned off. Accordingly, the sense-amplifying part 51 is disabled.

On the other hand, if the high state sense amplifier enable signal SE is introduced, the high state control signal CS is introduced to the sense-amplifying part 51 via the NOR gate GA63 of the control part 53.

The NMOS transistors MN65, MN68 in the first and second sense-amplifying stages 51-1, 51-2 are both turned on. Hence the first sense-amplifying stage senses and amplifies the input signals introduced via first and second input terminals IN61, IN62, and then produces predetermined output signals SOUT61, SOUT62. Afterwards, the second sense-amplifying stage 51-2 senses and amplifies the output signals SOUT61, SOUT62 from the first sense-amplifying stage 51-1, and then produces final output signals OUT61, OUT62 having different voltage levels from each other.

When the data sensing operation of the sense-amplifying part 51 is terminated, the NAND gate GA62 of the control part 53 produces a high state detecting signal to data sensing termination. Thus the NOR gate GA63 produces the low state control signal CS to the sense-amplifying part 51. Accordingly, if the data sensing operation is terminated, the sense-amplifying part 51 is automatically disabled regardless of the high state sense amplifier enable signal SE.

The control part 53 of the second embodiment of the present invention can be embodied in alternative forms as illustrated in FIG. 5B and FIG. 5C.

Figure 7:
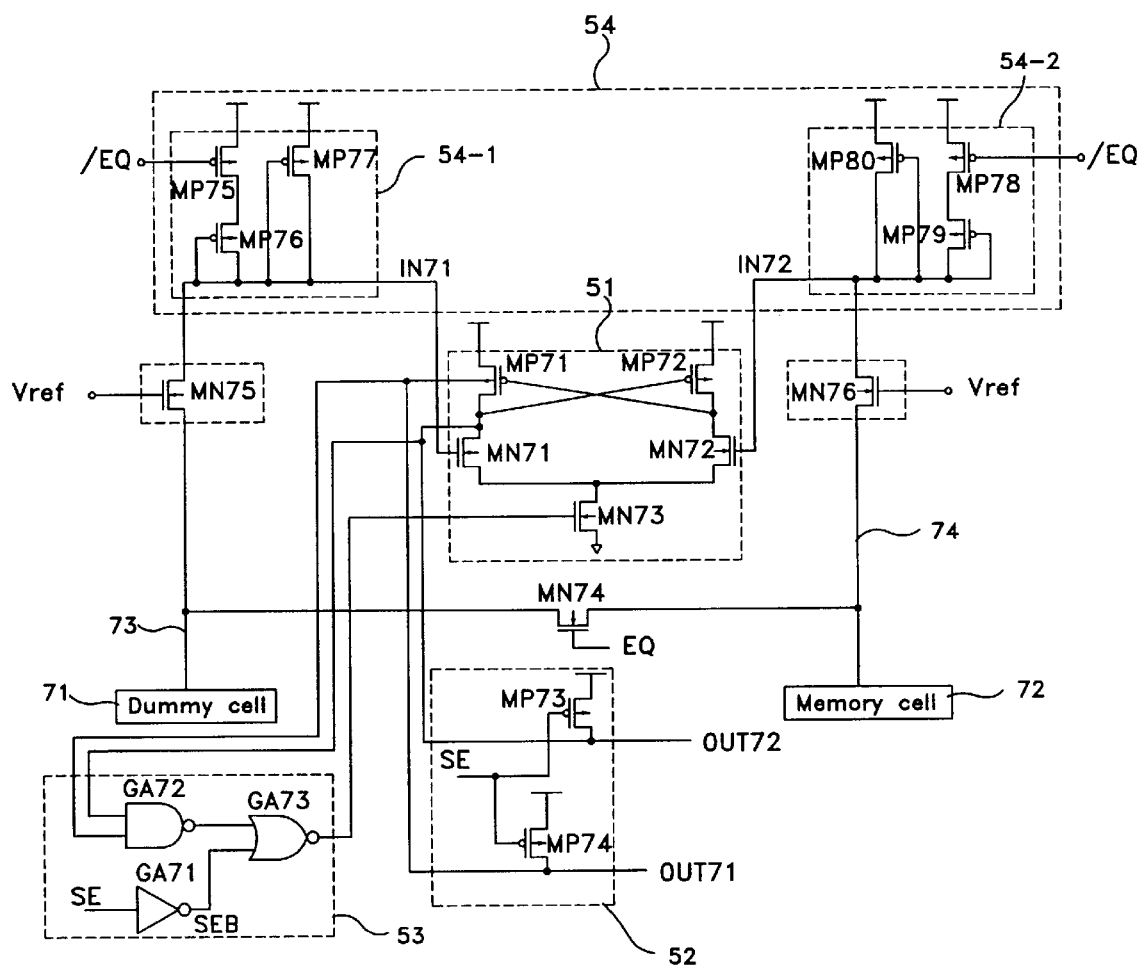
FIG. 7 is a detailed circuit diagram of a sense amplifier according to a third embodiment of the present invention.

FIG. 7 is a detailed circuit diagram of a sense amplifier according to a third embodiment of the present invention.

Referring to FIG. 7, the third embodiment of the sense amplifier comprises a sense-amplifying part 51 for sensing and amplifying voltages of a dummy line 73 and a bit line 74, i.e., first and second input signals IN71, IN72, and producing output signals via output terminals OUT71, OUT72; a charging part 52 for charging the output terminals OUT71, OUT72 to the power supply voltage according to the sense amplifier enable signal SE, prior to sensing and amplifying operation; a control part 53 for generating a control signal CS for disabling the sense-amplifying part 51 if the sense-amplifying part 51 receives the input signals IN71, IN72 and then produces output signals having different voltage levels from each other during application of the sense amplifier enable signal SE.

The sense-amplifying part 51, charging part 52, and control part 53 have structures identical to those of the corresponding parts of the first and second embodiments.

Also, the sense amplifier according to the third embodiment further comprises a precharging part 54, comprising first precharging means 54-1 including PMOS transistors MP75~MP77 for precharging the dummy line 73 according to an equalizing signal /EQ, and second precharging means 54-2 including PMOS transistors MP78~MP80 for precharging the bit line 74 according to the signal /EQ; a NMOS transistor MN74 for equalizing the voltage of the dummy line 73 and the bit line 74 according to the equalizing signal EQ; NMOS transistors MN75, MN76 of pass transistor driven by a reference voltage Vref from a reference voltage generator(not illustrated) for supplying the voltages from the dummy line 73 and the bit line 74 as input signals to the gates of the NMOS transistors MN71, MN72 in the sense-amplifying part 51 respectively.

If the low state sense amplifier enable signal SE is introduced into the sense amplifier according to the third embodiment, the precharging part 54 activated by the equalizing signal /EQ precharges the dummy line 73 and the bit line 74 to a desired voltage. Also, the charging part 52 activated by the sense amplifier enable signal SE charges the output terminals OUT71, OUT72 to the power supply voltage Vcc of a high state.

Accordingly, the control part 53 produces the low state control signal CS via the NOR gate GA73 and disables the sense-amplifying part 51.

On the other hand, if the high state sense amplifier enable signal is introduced, the control part 53 produces the high state control signal CS via the NOR gate GA73 of the control part 53 thus enabling the sense-amplifying part 51.

Accordingly, the sense-amplifying part 51 senses and amplifies the input signals IN71, IN72, i.e., voltages from the dummy line 73 and the bit line 74 respectively and produces output signals having different voltage levels from each other via first and second output terminals OUT71, OUT72.

When the sense-amplifying part 51 completes the data sensing operation according to the high state sense amplifier enable signal SE, the output signal of the NAND gate GA72 turns high state. Then the output signal of the NAND gate GA72 is introduced into the NOR gate GA73 producing the low state control signal CS into the sense-amplifying part 51. Thus the sense-amplifying part 51 is disabled and the data sense operation is terminated.

The control part 53 of the third embodiment of the present invention can be embodied in alternative forms as illustrated in FIG. 5B and FIG. 5C.

Figure 8:
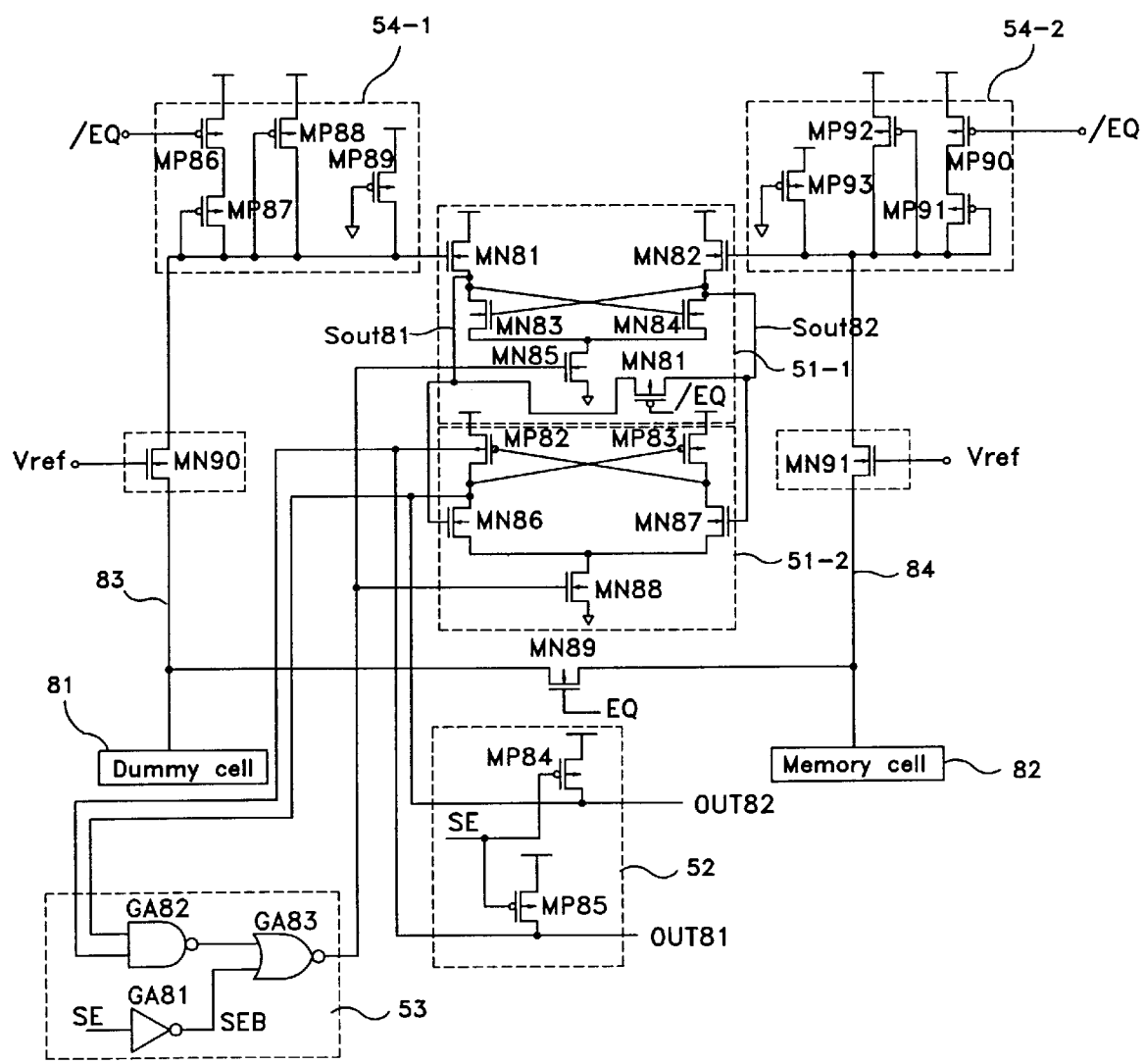
FIG. 8 is a detailed circuit diagram of a sense amplifier for a semiconductor memory device according to a fourth embodiment of the present invention.

FIG. 8 is a detailed circuit diagram of a sense amplifier for a semiconductor memory device according to a fourth embodiment of the present invention.

The fourth embodiment of the present invention like the third embodiment comprises a sense-amplifying part 51, charging part 52, control part 53, and a precharging part 54. The structure of the charging part 52, control part 53, and the precharging part are identical to that of the third embodiment.

The sense-amplifying part 51 of the fourth embodiment comprises two sense-amplifying stages 51-1, 51-2 which have identical structures to that of the second embodiment.

Similarly with the above described embodiments, the sense amplifier of the fourth embodiment reduces current consumption by introducing the control signal CS into the sense-amplifying part 51 upon termination of the data sensing operation.

The control part 53 of the fourth embodiment of the present invention can be embodied in alternative forms as illustrated in FIG. 5B and FIG. 5C.

Figure 9A:
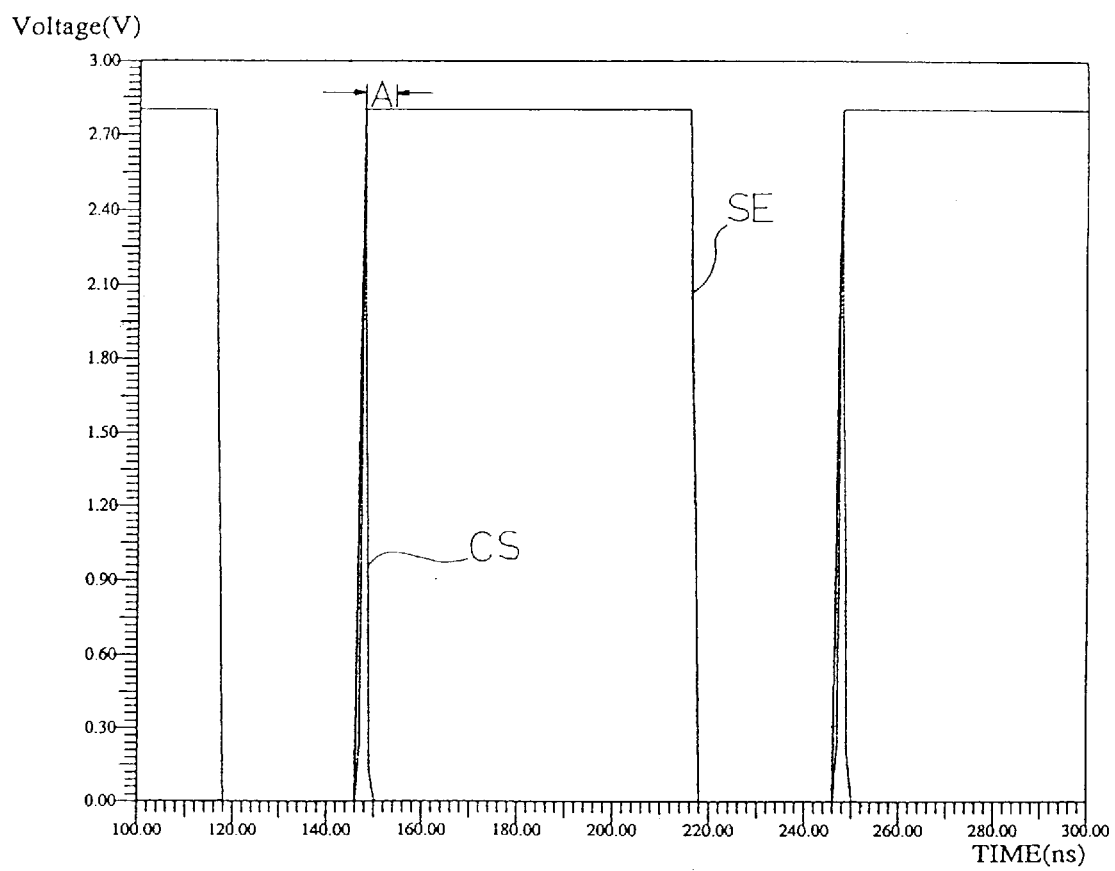
FIGS. 9A and 9B are diagrams illustrating voltage characteristics of the sense amplifier according to the embodiments of the present invention and the prior art respectively.
Figure 9B:
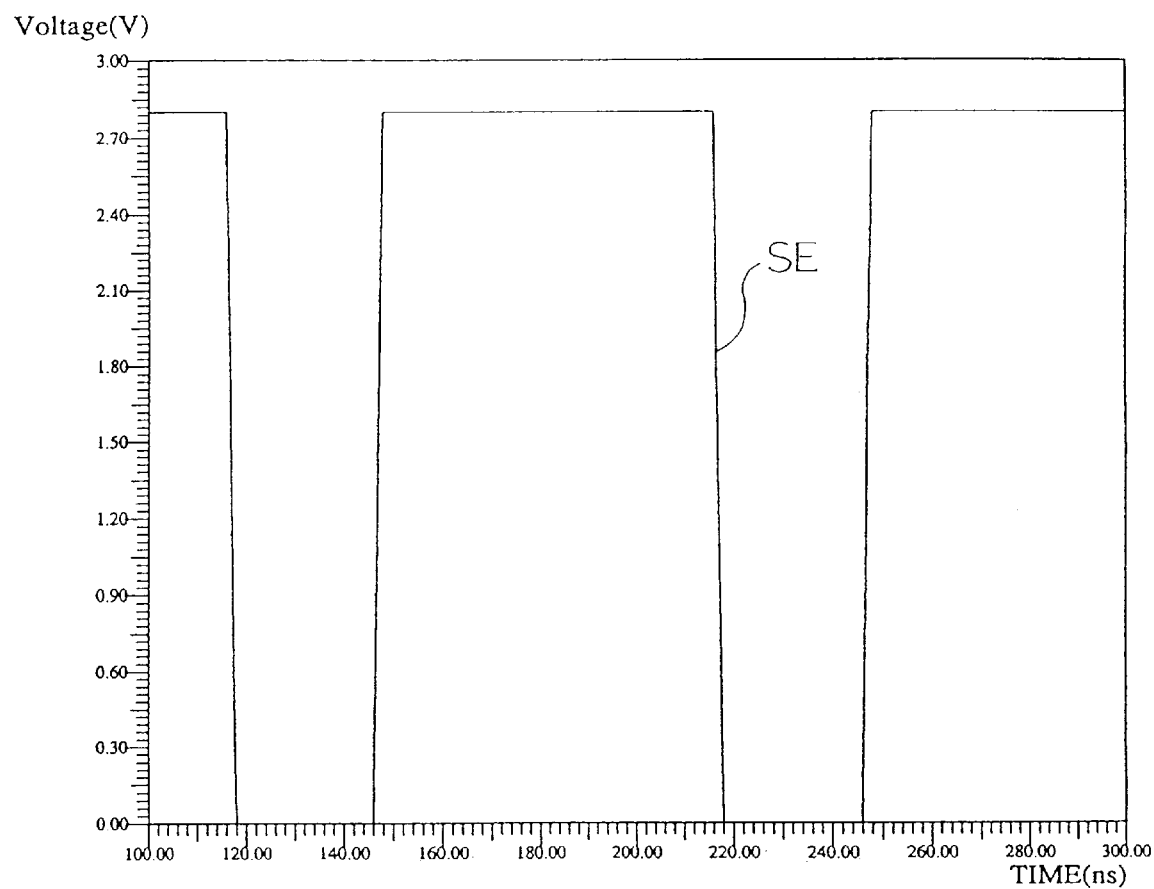

FIG. 9A and FIG. 9B are diagrams illustrating voltage characteristics of the sense amplifier according to the embodiments of the present invention and the prior art respectively. Contrary to the conventional sense amplifier where the data sensing operation is carried out during the entire high state sense amplifier enable signal, the data sensing operation of the present invention is carried out only during the data sensing period "A" according to the control signal CS from the control part 53 regardless of the high state sense amplifier enable signal SE.

Figure 10A:
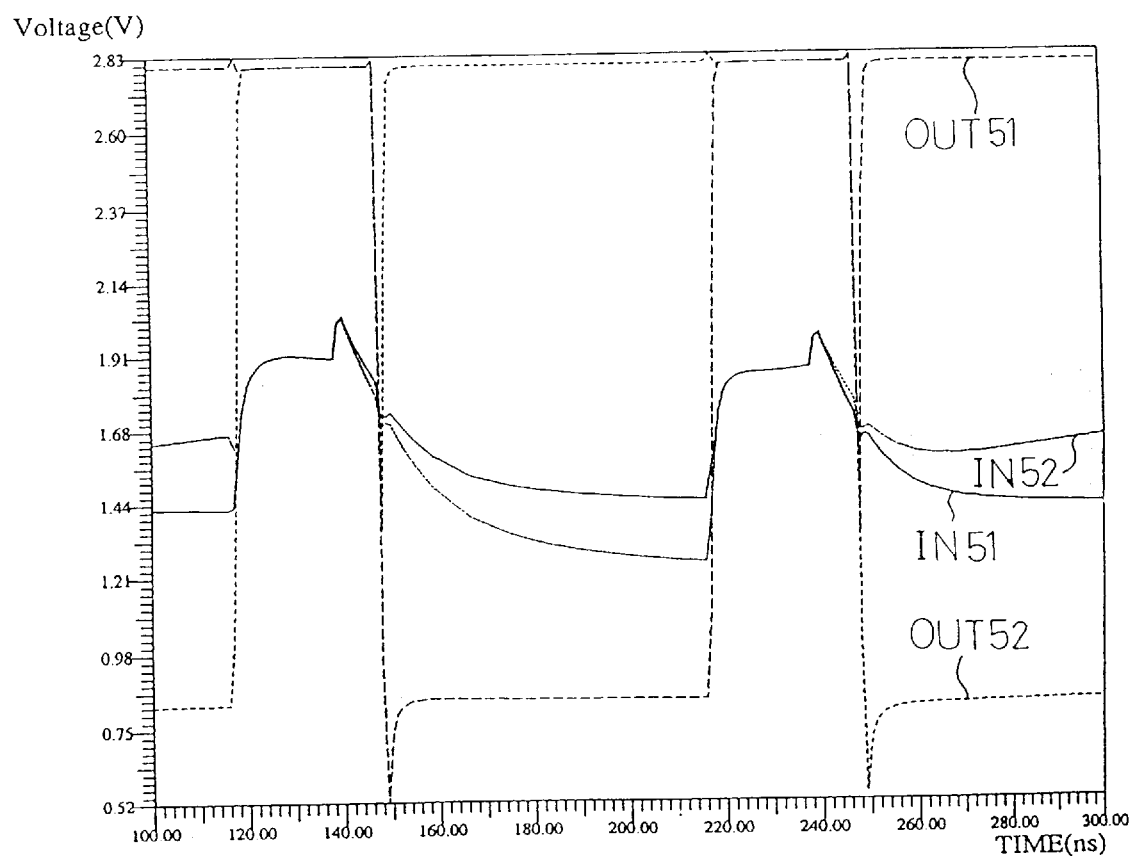
FIGS. 10A and 10B are diagrams illustrating the output characteristics of the present invention and the prior art respectively.
Figure 10B:
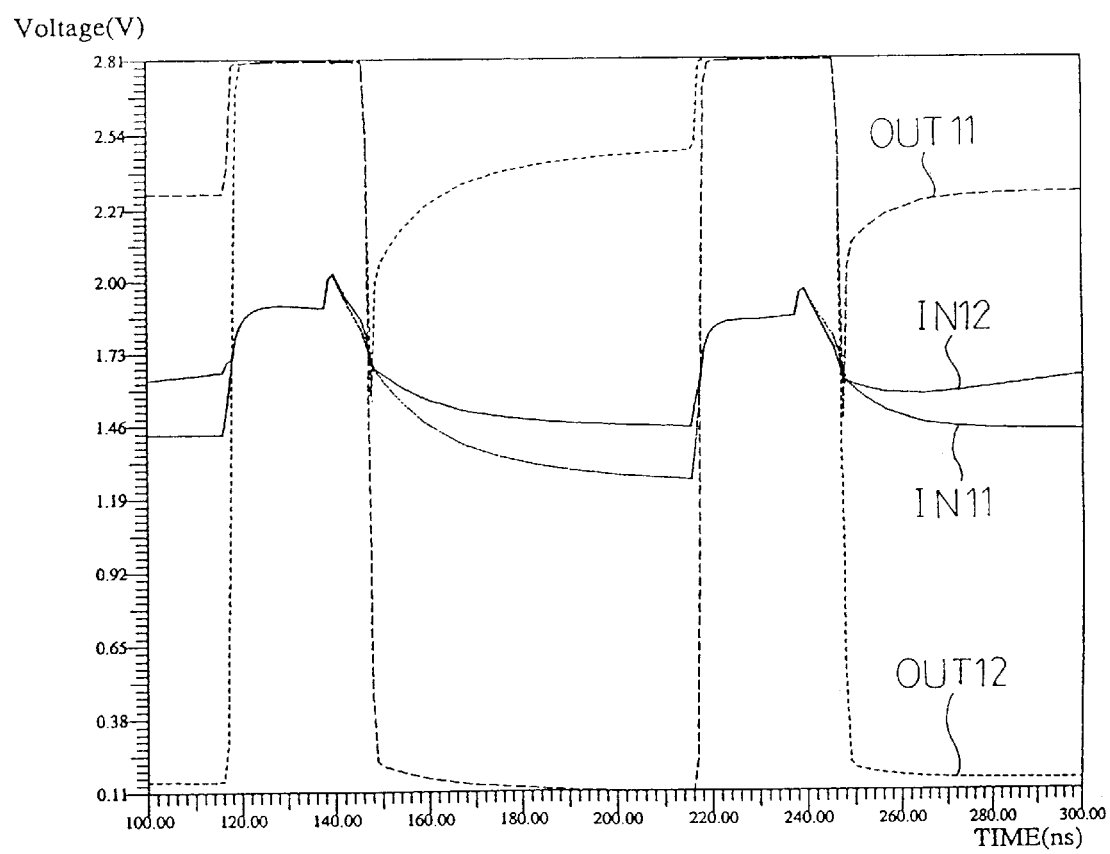

FIG. 10A and FIG. 10B are diagrams illustrating the output characteristics of the present invention and the prior art respectively. If output signals of different levels are produced in the present invention, the sense-amplifying part 51 is disabled regardless of the high state sense amplifier enable signal according to the control signal CS from the control part 53. In other words, the sense-amplifying part 51 is enabled only during the data sensing period "A". Accordingly, the sensing operation executed only during data sensing period "A".

The following Table 1 and Table 2 are current information for the sense amplifier of the present invention and the prior art respectively. Table 1 and Table 2 are current tables in case where the sense-amplifying part comprises a single sense-amplifying stage.

TABLE 1

| NODE | CURRENT | | |
|---|---|---|---|
|  | Total current (μA/CYCLE) | Average current(μA) | RMS current (μA) |
| MN53 | 0.00034 | 2.65333 | 28.51946 |
| Control part | 0.00117 | 9.02608 | 19.28159 |

TABLE 2

| NODE | CURRENT | | |
|---|---|---|---|
|  | Total current (μA/CYCLE) | Average current(μA) | RMS current (μA) |
| MN51 | 0.01114 | 85.66983 | 118.99302 |

Figure 11A:
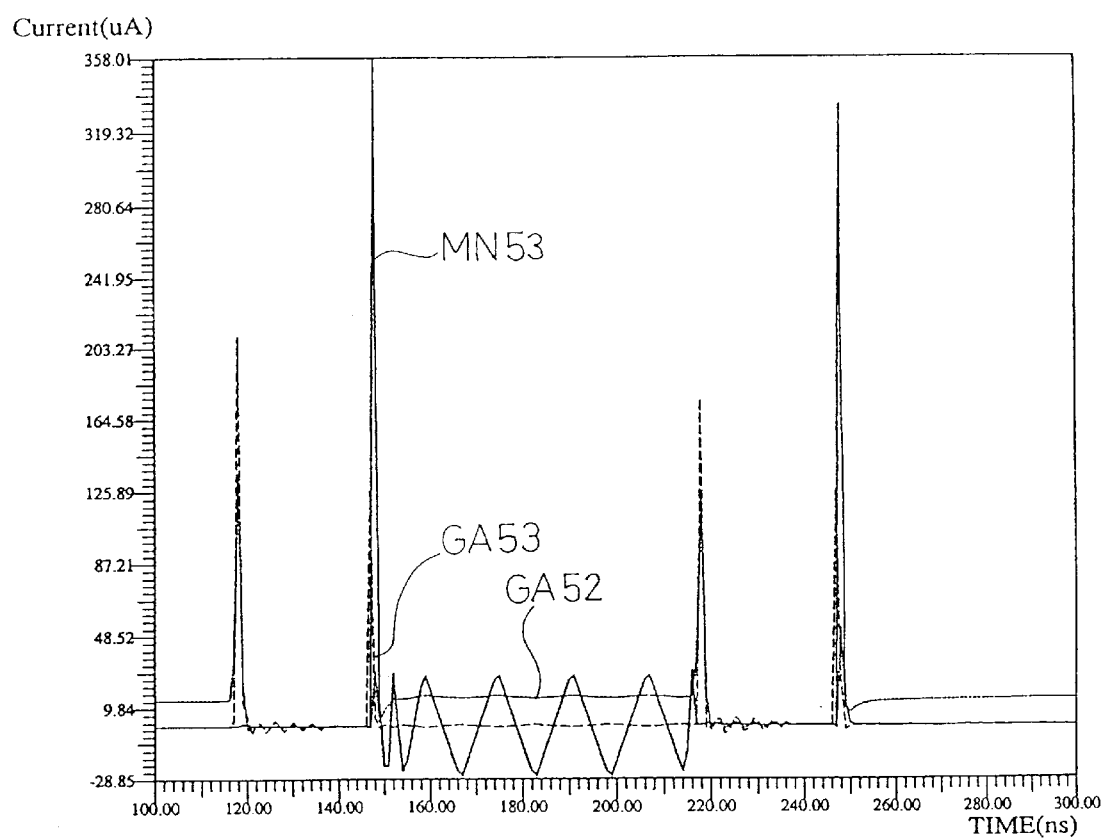
FIGS. 11A and 11B are diagrams illustrating characteristics of the current flowing through the enabling means of the sense-amplifying part of the present invention and the prior art respectively.
Figure 11B:
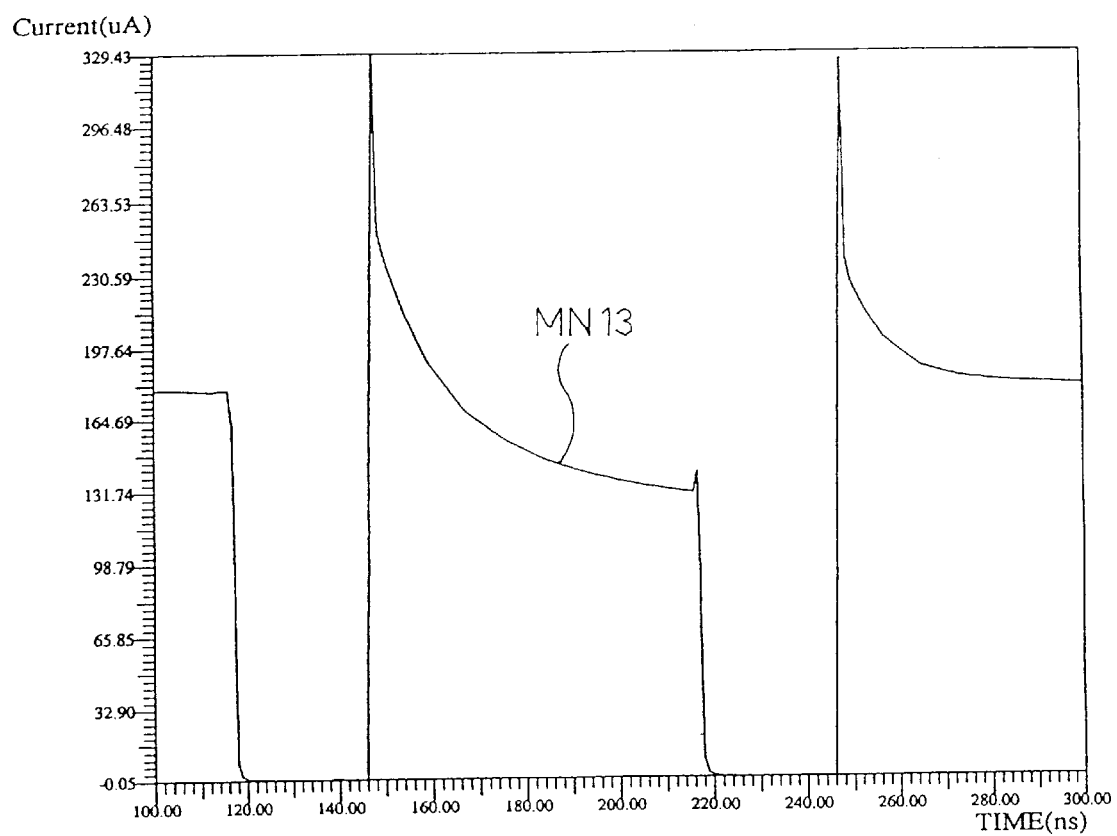

FIG. 11A and FIG. 11B are diagrams illustrating characteristics of the current flowing through the enabling means of the sense-amplifying part, i.e., NMOS transistors MN53, MN13 respectively of the present invention and the prior art.

Regarding to Table 1, 2, and FIG. 11A, FIG. 11B, regardless of supplement of the control part in the present invention, one can see that considerable amount of current consumption is reduced compared to the conventional sense amplifier.

The following Table 3 and Table 4 are current information for the sense amplifier of the present invention and the prior art respectively. Table 3 and Table 4 are current tables in case where the sense-amplifying part comprises two sense-amplifying stages.

TABLE 3

| NODE | CURRENT | | |
|---|---|---|---|
|  | Total current (μA/CYCLE) | Average current(μA) | RMS current (μA) |
| MN65 | 0.00018 | 1.39573 | 12.85040 |
| MN68 | 0.00044 | 3.40372 | 31.88686 |
| Control part | 0.00120 | 9.22174 | 18.15290 |

TABLE 4

| NODE | CURRENT | | |
|---|---|---|---|
|  | Total current (μA/CYCLE) | Average current(μA) | RMS current (μA) |
| MN35 | 0.01223 | 94.04098 | 130.13755 |
| MN38 | 0.00365 | 28.08135 | 61.74302 |

Figure 12A:
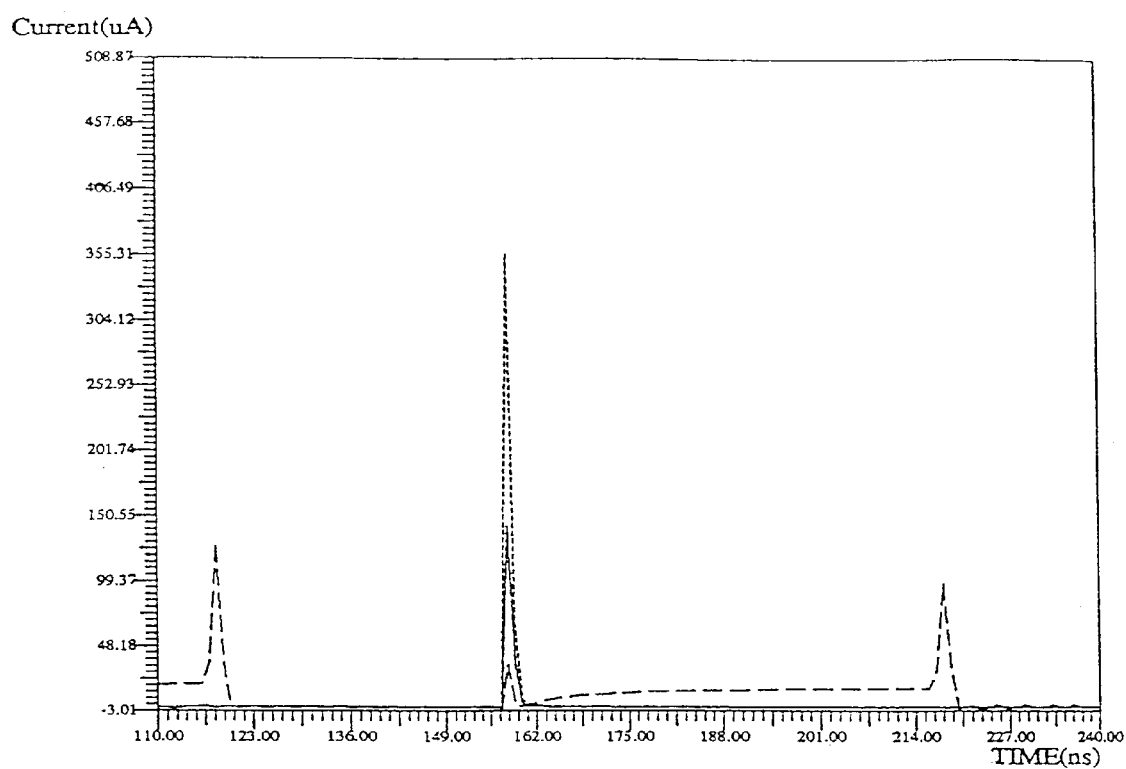
FIGS. 12A and 12B are diagrams illustrating current characteristics of the present invention and the prior art respectively.
Figure 12B:
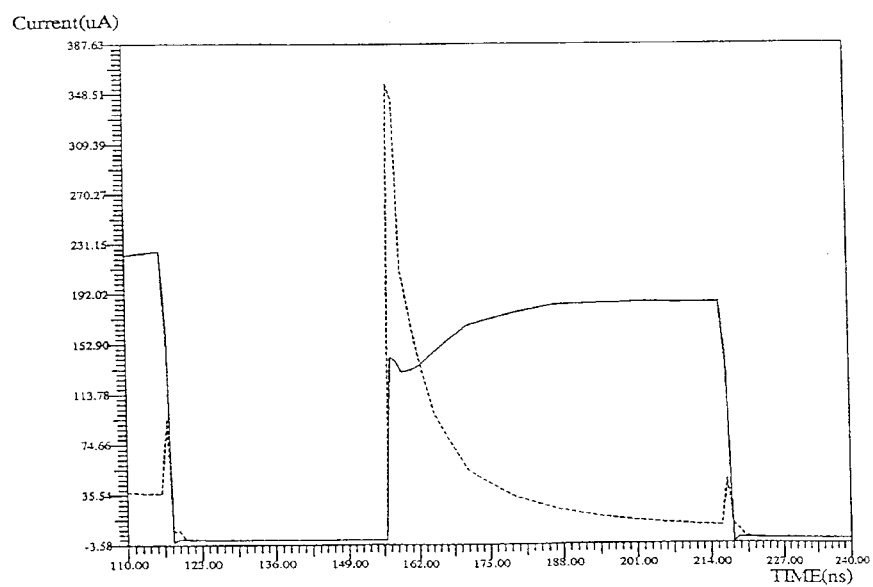

FIG. 12A and FIG. 12B are diagrams illustrating current characteristics of the present invention and the prior art respectively in case where the present and conventional sense amplifiers both have two sense-amplifying stages.

Regarding to Tables 3, 4, and FIG. 12A, FIG. 12B, even the sense amplifier comprises two sense-amplifying stages in the present invention, one can see that the present invention can reduce considerable amount of current consumption compared to the conventional sense amplifier.

According to the above results, the sense amplifier according to the present invention is enabled only during the data sense period, and disabled upon termination of the data sense period regardless of the high state sense amplifier enable signal. Hence, compared to the conventional sense amplifier where the current flow during the entire high state sense amplifier signal, the present invention reduces considerable amount of current consumption by letting the current flow only during the data sense period.

It will be apparent to those skilled in the art that various modifications and variations can be made in the low power sense amplifier of the present invention without departing from the spirit or scope of the invention. Thus, it is intended that the present invention cover the modifications and variations of this invention provided they come within the scope of the appended claims and their equivalents.

What is claimed is:

1. A sense amplifier for semiconductor memory devices which senses and amplifies input signals introduced into first and second input terminals according to an internal control signal, and produces first and second output signals having different levels from each other via first and second output terminals respectively, said sense amplifier comprising:

sense-amplifying means for sensing and amplifying the input signals introduced to said first and second input terminals, and producing the first and second output signals via said first and second output terminals, according to the internal control signal;

charging means for charging said first and second output terminals to a desired voltage prior to sense-amplifying operation of said input signals in said sense-amplifying means in accordance with an external control signal; and control means for receiving the external control signal and the first and second output signals from said sense-amplifying means, and producing the internal control signal to said sense-amplifying means upon termination of sense-amplifying operation by said sense-amplifying means.

2. The sense amplifier for semiconductor memory devices as claimed in claim 1, wherein said sense-amplifying means comprises:

first means for sensing and amplifying said first and second input signals from said first and second input terminals, and producing said first and second output signals through first and second output terminals;

a latch for storing said first and second output signals from said first means; and second means for enabling said sense-amplifying means with accordance to said internal control signal of said control means.

3. The sense amplifier for semiconductor memory devices as claimed in claim 2, wherein said first means for sensing and amplifying said input signals in said sense-amplifying means comprises:

a first NMOS transistor, wherein said first input signal is introduced to its gate, and said first output signal is produced from its drain connected to said latch; and a second NMOS transistor, wherein said second input signal is introduced to its gate, and said second output signal is produced from its drain connected to said latch.

4. The sense amplifier for semiconductor memory devices as claimed in claim 2, wherein said latch of said sense amplifying means comprises:

a first PMOS transistor, wherein said second output signal is introduced to its gate, a power supply voltage introduced to its source, and said first means connected to its drain; and a second PMOS transistor, wherein said first output signal introduced to its gate, the power supply voltage introduced to its source, and said first means connected to its drain.

5. The sense amplifier for semiconductor memory devices as claimed in claim 2, wherein said second means in said sense-amplifying means comprises a third NMOS transistor, wherein said internal control signal from said control means is introduced to its gate, said sense-amplifying means is connected to its drain, and its source is grounded.

6. The sense amplifier for semiconductor memory devices as claimed in claim 1, wherein said charging means comprises:

first charging means for charging said first output terminal to a power supply voltage; and second charging means for charging said second output terminal to the power supply voltage.

7. The sense amplifier for semiconductor memory devices as claimed in claim 6, wherein said first charging means comprises a third PMOS transistor in which said external control signal is introduced to its gate, the power supply voltage is applied to its source, and said first output terminal is connected to its drain, and said second charging means comprises a fourth PMOS transistor in which said external control signal is introduced to its gate, the power supply voltage is applied to its source, and said second output terminal is connected to its drain.

8. The sense amplifier for semiconductor memory devices as claimed in claim 1, wherein said control means comprises:

inverting means for inverting said external control signal;

detecting means for receiving said first and second output signals from said sense-amplifying means, and detecting termination of sense-amplifying operation of said sense-amplifying means; and control signal generating means for receiving said inverted external control signal from said inverting means and an output signal of said detecting means, and generating said internal control signal to said sense-amplifying means.

9. The sense amplifier for semiconductor memory devices as claimed in claim 8, wherein said inverting means for said control means comprises an inverting gate which inverts said external control signal.

10. The sense amplifier for semiconductor memory devices as claimed in claim 8, wherein said detecting means for said control means comprises a NAND gate which receives said first and second output signals from said first and second output terminals, and produces a high state signal as a detecting signal to said control signal generating means when said sense-amplifying means produces said first and second output signals having different levels for each other.

11. The sense amplifier for semiconductor memory devices as claimed in claim 8, wherein said detecting means for said control means comprises a two input XNOR gate which receives said first and second output signals from said first and second output terminals, and produces a high state signal as a detecting signal to said control signal generating means when said sense-amplifying means produces said first and second output signals having different levels.

12. The sense amplifier for semiconductor memory devices as claimed in claim 8, wherein said control signal generating means comprises a NOR gate which receives the detecting signal from said detecting means and said inverted external control signal from said inverting means, and produces said internal control signal for disabling said sense-amplifying means upon termination of sense-amplifying operation of said sense amplifying means.

13. The sense amplifier for semiconductor memory devices as claimed in claim 1, wherein said control means comprises:

an inverting means for inverting said external control signal; and a control signal generating means for receiving said first and second output signals from said first and second output terminals and said inverted external control signal from said inverting means, and providing said internal control signal to said sense amplifying means.

14. The sense amplifier for semiconductor memory devices as claimed in claim 13, wherein said inverting means for said control means comprises an inverting gate for receiving and inverting said external control signal.

15. The sense amplifier for semiconductor memory devices as claimed in claim 13, wherein said control signal generating means of said control means comprises a three input XNOR gate for receiving first and second output signals from said sense-amplifying means and said inverted external control signal from said inverting means, and producing said internal control signal for disabling said sense-amplifying means upon termination of sense-amplifying operation of said sense amplifying means.

16. The sense amplifier for semiconductor memory devices as claimed in claim 1, wherein said sense-amplifying means comprises:

a first sense-amplifying stage for sensing and amplifying said first and second input signals from said first and second input terminals, and generating output signals; and a second sense-amplifying stage for sensing and amplifying the output signals from said first sense-amplifying stage, and providing said first and second output signals through said first and second output terminals.

17. The sense amplifier for semiconductor memory devices as claimed in claim 16, wherein said first sense-amplifying stage comprises:

first means for sensing and amplifying said first and second input signals from said first and second input terminals, and providing said output signals to said second sense-amplifying stage;

a first latch for storing said output signals from said first means; and second means for enabling said first means with accordance to said internal control signal from said control means.

18. The sense amplifier for semiconductor memory devices as claimed in claim 17, wherein said first means for said first sense-amplifying stage comprises:

a first NMOS transistor in which said first input signal is introduced to its gate, a power supply voltage is introduced to its drain, and one of said output signals is produced from its source connected to said first latch and said second sense-amplifying stage; and a second NMOS transistor in which said second input signal is introduced to its gate, said power supply voltage is introduced to its drain, and another of said output signals is produced from its source connected to said first latch and said second sense-amplifying stage.

19. The sense amplifier for semiconductor memory devices as claimed in claim 17, wherein said first latch of said first sense-amplifying stage comprises:

a third NMOS transistor in which another output signal from said first means is introduced to its gate, said first means is connected to its drain, and said second means is connected to its source; and a fourth NMOS transistor in which one output signal from said first means is introduced to its gate, said first means is connected to its drain, and said second means is connected to its source.

20. The sense amplifier for semiconductor memory devices as claimed in claim 17, wherein said second means for said first sense-amplifying stage comprises a fifth NMOS transistor in which said internal control signal is introduced from said control means, said first latch is connected to its drain, and said source is grounded.

21. The sense amplifier for semiconductor memory devices as claimed in claim 16, wherein said second sense-amplifying stage of said sense amplifying means comprises:
   third means for sensing and amplifying said output signals of said first sense-amplifying stage and producing first and second output signals having different levels from each other to said first and second output terminals;
   a second latch for storing said first and second output signals from third means; and
   fourth means for enabling said third means with accordance to said internal control signal form said control means.

22. The sense amplifier for semiconductor memory devices as claimed in claim 21, wherein said third means of said second sense-amplifying stage comprises:
   a sixth NMOS transistor for receiving one of said output signals of said first sense-amplifying stage via its gate, and providing said first output signal to said first output terminal via its drain connected to said second latch; and
   a seventh NMOS transistor for receiving another of said output signals of said first sense-amplifying stage via its gate, and providing said second output signal to the second output terminal via its drain connected to said second latch.

23. The sense amplifier for semiconductor memory devices as claimed in claim 21, wherein said second latch of said second sense-amplifying stage comprises:
   a first PMOS transistor in which said second output signal is introduced to its gate, a power supply voltage is introduced to its source, and said third means is connected to its drain; and
   a second PMOS transistor in which said first output signal is introduced to its gate, the power supply voltage is introduced to its source, and said third means is connected to its drain.

24. The sense amplifier for semiconductor memory devices as claimed in claim 21, wherein said third means of said second sense-amplifying stage comprises an eighth NMOS transistor in which said internal control signal from said control means is introduced to its gate, said third means is connected to its drain, and its source is grounded.

25. The sense amplifier for semiconductor memory devices as claimed in claim 1, wherein said external signal is a sense amplifier enable signal.

26. A sense amplifier for semiconductor memory devices which senses and amplifies first and second input signals introduced into first and second input terminals, and produces first and second output signals having different levels from each other via first and second output terminals respectively, said sense amplifier comprising:
   precharging means for precharging first and second input terminals to a selected voltage with accordance to an equalizing signal;
   sense-amplifying means for sensing and amplifying said first and second input signals from said first and second input terminals, and producing said first and second output signals via said first and second output terminals;
   charging means for charging said first and second output terminals to the desired voltage level prior to sensing and amplifying operation in said sense-amplifying means with accordance to an external control signal; and
   control means for receiving said first and second output signals from said sense-amplifying means and said external control signal and producing said internal control signal to said sense-amplifying means when said sense-amplifying means produces output signals having different voltage levels from each other.

27. The sense amplifier for semiconductor memory devices as claimed in claim 26, wherein a dummy line voltage is introduced to said first input terminal as said first input signal, a bit line voltage is introduced to said second input terminal as said second input signal.

28. The sense amplifier for semiconductor memory devices as claimed in claim 26, wherein said sense-amplifying means comprises:
   first means for sensing and amplifying said first and second input signals, and producing said first and second output signals through said first and second output terminals;
   a latch for storing said first and second output signals from said first means; and
   second means for enabling said first means with accordance to said internal control signal from said control means.

29. The sense amplifier for semiconductor memory devices as claimed in claim 28, wherein said first means in said sense-amplifying means comprises:
   a first NMOS transistor in which said first input signal is introduced to its gate, and said first output signal is produced to said first output terminal via its drain connected to said latch; and
   a second NMOS transistor in which said second input signal is introduced to its gate, and said second output signal is produced to said second output terminal via its drain connected to said latch.

30. The sense amplifier for semiconductor memory devices as claimed in claim 28, wherein said latch comprises:
   a first PMOS transistor in which said first output signal is introduced to its gate, a power supply voltage is introduced to its source, and said first means is connected to its drain; and
   a second PMOS transistor in which said second output signal is introduced to its gate, the power supply voltage is introduced to its source, and said first means is connected to its drain.

31. The sense amplifier for semiconductor memory devices as claimed in claim 28, wherein said second means for said sense-amplifying means comprises a third NMOS transistor in which said internal control signal from said control means is introduced to its gate, said first means is connected to its drain, and its source is grounded.

32. The sense amplifier for semiconductor memory devices as claimed in claim 26, wherein said charging means comprises:
   first charging means for charging said first output terminal to a power supply voltage; and second charging means for charging said second output terminal to the power supply voltage.

33. The sense amplifier for semiconductor memory devices as claimed in claim 32, wherein said first charging means comprises a third PMOS transistor in which said external control signal is introduced to its gate, the power supply voltage is applied to its source, and said first output terminal is connected to its drain, and said second charging means comprises a fourth PMOS transistor in which said external control signal is introduced to its gate, the power supply voltage is applied to its source, and said second output terminal is connected to its drain.

34. The sense amplifier for semiconductor memory devices as claimed in claim 26, wherein said control means comprises:

inverting means for inverting said external control signal;

detecting means for receiving the first and second output signals from said sense-amplifying means through the respective first and second output terminals and detecting termination of the sensing and amplifying operation of said sense-amplifying means; and control signal generating means for receiving said external control signal inverted through said inverting means and an output signal of said detecting means an generating said internal control signal to said sense-amplifying means.

35. The sense amplifier for semiconductor memory devices as claimed in claim 34, wherein said inverting means for said control means comprises an inverting gate which receives and inverts said external control signal.

36. The sense amplifier for semiconductor memory devices as claimed in claim 34, wherein said detecting means for said control means comprises a NAND gate which receives said first and second output signals from said first and second output terminals, and produces as a detecting signal a high state output signal when said output signals having different levels for each other are produced upon termination of sense-amplifying operation.

37. The sense amplifier for semiconductor memory devices as claimed in claim 34, wherein said detecting means for said control means comprises a XNOR gate which receives said first and second output signals from said first and second output terminals, and produces as a detecting signal a high state output signal when said output signals of said sense-amplifying means having different levels are produced upon termination of sense-amplifying operation.

38. The sense amplifier for semiconductor memory devices as claimed in claim 34, wherein said control signal generating means comprises a NOR gate which receives the detecting signal from said detecting means and inverted external control signal from said inverting means, and produces said internal control signal for disabling said sense-amplifying means upon termination of sense-amplifying operation of said sense-amplifying means.

39. The sense amplifier for semiconductor memory devices as claimed in claim 26, wherein said control means comprises:

inverting means for receiving and inverting said external control signal; and control signal generating means for receiving said first and second output signals from said first and second output terminals and said inverted external control signal from said inverting means, and providing said internal control signal to said sense-amplifying means.

40. The sense amplifier for semiconductor memory devices as claimed in claim 39, wherein said inverting means for said control means comprises an inverting gate for receiving and inverting said external control signal.

41. The sense amplifier for semiconductor memory devices as claimed in claim 39, wherein said control signal generating means of said control means comprises a three input XNOR gate for receiving said first and second output signals from said sense-amplifying means and said inverted external control signal from said inverting means, and producing said internal control signal for disabling said sense-amplifying means upon termination of sensing and amplifying operation.

42. The sense amplifier for semiconductor memory devices as claimed in claim 26, wherein said sense-amplifying means comprises:

a first sense-amplifying stage for sensing and amplifying said first and second output signals from said first and second input terminals, and generating output signals; and a second sense-amplifying stage for sensing and amplifying said output signals from said first sense-amplifying stage, and generating the first and second output signals through said first and second output terminals.

43. The sense amplifier for semiconductor memory devices as claimed in claim 42, wherein said first sense-amplifying stage comprises:

first means for sensing and amplifying said first and second input signals from said first and second output terminals, and producing said output signals to said second sense-amplifying stage;

a first latch for storing said first and second output signals from said first means; and second means for enabling said first means with accordance to said internal control signal from said control means.

44. The sense amplifier for semiconductor memory devices as claimed in claim 43, wherein said first means for said first sense-amplifying stage comprises;

a first NMOS transistor in which said first input signal is introduced to its gate, said power supply voltage is applied to its drain, and one of said output signals from said first sense-amplifying stage is produced from its source connected to said first latch and said second sense-amplifying stage; and a second NMOS transistor in which said second input signal is introduced to its gate, said power supply voltage is applied to its drain, and another of said output signals from said first sense-amplifying stage is produced from its source connected to said first latch and said second sense-amplifying stage.

45. The sense amplifier for semiconductor memory devices as claimed in claim 43, wherein said first latch of said first sense-amplifying stage comprises:

a third NMOS transistor in which another of said output signals is introduced to its gate, said first means is connected to its drain, and said second means is connected to its source; and a fourth NMOS transistor in which one of said output signals is introduced to its gate, said first means is connected to its drain, and said second means is connected to its source.

46. The sense amplifier for semiconductor memory devices as claimed in claim 43, wherein said second means of said first sense-amplifying stage comprises an fifth NMOS transistor in which said internal control signal from said control means is introduced to its gate, said first latch is connected to its drain, and its source is grounded.

47. The sense amplifier for semiconductor memory devices as claimed in claim 42, wherein said second sense-amplifying stage of said sense-amplifying means comprises;
 third means for sensing and amplifying output signals of said first sense-amplifying stage, and producing said first and second output signals through said first and second output terminals;
 a second latch for storing said first and second output signals from said third means; and
 fourth means for enabling said sense-amplifying stage with accordance to said internal control signal from said control means.

48. The sense amplifier for semiconductor memory devices as claimed in claim 47, wherein said third means for said second sense-amplifying stage comprises:
 a sixth NMOS transistor for receiving one of said output signals from first sense-amplifying stage via its gate, providing said first output signal to the second output terminal via its drain connected to said second latch; and
 a seventh NMOS transistor for receiving another of said output signals from said first sense-amplifying stage via its gate, and providing said second output signal to said second output terminal via its drain connected to said second latch.

49. The sense amplifier for semiconductor memory devices as claimed in claim 47, wherein said second latch of said second sense-amplifying stage comprises:
 a first PMOS transistor in which said second output signal is introduced to its gate, a power supply voltage is introduced to its source, and said third means is connected to its drain; and
 a second PMOS transistor in which said first output signal is introduced to its gate, the power supply voltage is introduced to its source, and said third means is connected to its drain.

50. The sense amplifier for semiconductor memory devices as claimed in claim 47, wherein said fourth means of said second sense-amplifying stage comprises an eighth NMOS transistor in which said internal control signal from said control means is introduced to its gate, said third means is connected to its drain, and its source is grounded.

51. The sense amplifier for semiconductor memory devices as claimed in claim 26, wherein said external control signal is a sense amplifier enable signal.

* * * * *